US011569819B1

(12) United States Patent
Shah et al.

(10) Patent No.: US 11,569,819 B1
(45) Date of Patent: Jan. 31, 2023

(54) HIGH-VOLTAGE TOLERANT INVERTER

(71) Applicant: Advanced Micro Devices, Inc., Santa Clara, CA (US)

(72) Inventors: Dhruvin Devangbhai Shah, Bangalore (IN); Jagadeesh Anathahalli Singrigowda, Bangalore (IN); Girish Anathahalli Singrigowda, Bangalore (IN); Prasant Kumar Vallur, Telangana (IN)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/486,466

(22) Filed: Sep. 27, 2021

(51) Int. Cl.
| | |
|---|---|
| *H03K 19/00* | (2006.01) |
| *H03K 19/0185* | (2006.01) |
| *H03K 3/356* | (2006.01) |
| *H03K 19/003* | (2006.01) |
| *H03K 3/012* | (2006.01) |

(52) U.S. Cl.
CPC ..... *H03K 19/018521* (2013.01); *H03K 3/012* (2013.01); *H03K 3/356113* (2013.01); *H03K 3/356182* (2013.01); *H03K 19/00315* (2013.01); *H03K 19/00384* (2013.01)

(58) Field of Classification Search
None
See application file for complete search history.

(56) References Cited

U.S. PATENT DOCUMENTS

| | | | | |
|---|---|---|---|---|
| 5,396,128 | A | | 3/1995 | Dunning et al. |
| 5,465,054 | A | * | 11/1995 | Erhart .............. H03K 19/00315 326/24 |
| 5,604,449 | A | * | 2/1997 | Erhart .............. H03K 19/00315 326/121 |
| 6,040,729 | A | | 3/2000 | Sanchez et al. |
| 6,392,440 | B2 | * | 5/2002 | Nebel .............. H03K 19/00315 326/83 |
| 6,980,032 | B1 | * | 12/2005 | Blankenship .. H03K 19/018521 326/83 |
| 7,190,191 | B1 | * | 3/2007 | Mathur ............ H03K 19/00315 710/302 |
| 7,659,748 | B2 | * | 2/2010 | Chandra .......... H03K 19/00384 326/88 |
| 8,901,970 | B2 | * | 12/2014 | Gonzalez .................. G05F 3/16 327/108 |

(Continued)

*Primary Examiner* — Tuan T Lam
(74) *Attorney, Agent, or Firm* — Polansky & Associates, P.L.L.C.; Paul J. Polansky

(57) ABSTRACT

A high-voltage tolerant circuit includes a first level shifter responsive to an input signal having a first logic high voltage and a first logic low voltage for providing a first intermediate signal having the first logic high voltage and a second logic low voltage referenced to a second reference voltage higher than the first logic low voltage, a second level shifter responsive to the input signal for providing a second intermediate signal having a second logic high voltage referenced to a first reference voltage lower than the first logic high voltage, and the first logic low voltage, an output stage responsive to the first and second intermediate signals for providing an output signal having the first logic high voltage and the first logic low voltage, and a reference voltage generation circuit providing the second logic high and second logic low voltages without drawing current from the reference voltage generation circuit.

20 Claims, 5 Drawing Sheets

(56) References Cited

U.S. PATENT DOCUMENTS

| | | | | |
|---|---|---|---|---|
| 9,149,613 | B2* | 10/2015 | Degen | A61M 1/28 |
| 10,483,973 | B2* | 11/2019 | Chen | H03K 19/00384 |
| 10,734,083 | B2* | 8/2020 | Wu | G05F 3/24 |
| 11,171,634 | B2* | 11/2021 | Chen | H03K 3/0377 |
| 2015/0130511 | A1* | 5/2015 | P | H03K 19/017509 |
| | | | | 326/88 |
| 2016/0105183 | A1* | 4/2016 | Kim | H03K 19/00315 |
| | | | | 327/333 |
| 2021/0152090 | A1* | 5/2021 | Amin | G06F 1/26 |
| 2021/0409020 | A1* | 12/2021 | Singrigowda | H03K 17/08122 |

* cited by examiner

HIGH-VOLTAGE TOLERANT INVERTER

BACKGROUND

An inverter is an electrical circuit that performs a logical inversion of a binary input logic signal to produce a binary output logic signal. Each of the input and output signals have voltage levels sufficient to indicate their respective logic states in a particular power supply voltage domain. For example, an input voltage has a minimum voltage level for logic circuitry to recognize a logic high state known as "$V_{IH}$", and a maximum voltage for the logic circuitry to recognize a logic low state known as "$V_{IL}$". Likewise, the circuitry provides an output voltage having a minimum voltage to indicate a logic high state known as "$V_{OH}$" and a maximum voltage to indicate to logic low state known as "VOL".

In complementary metal-oxide-semiconductor (CMOS) circuitry, the $V_{IH}$ and $V_{OH}$ levels are approximately equal to the more-positive power supply voltage because P-channel MOS transistors are fully conductive as their drain voltages rise to around the level of their source voltages. Likewise, the $V_{IL}$ and VOL levels are very close to the more-negative power supply voltage, typically at ground or 0 volts, because N-channel MOS transistors are fully conductive when their drain voltages fall to around the level of their source voltages. Moreover, CMOS logic circuits do not consume any significant static current, but only consume dynamic current during actual switching. As CMOS manufacturing technology has improved with smaller and smaller transistors, CMOS circuits are able to switch faster using lower and lower power supply voltages, while reducing power consumption. Because of these characteristics, CMOS has become the predominant technology used for modern logic integrated circuits.

However, as CMOS transistor sizes have shrunk, the voltages to which they may be reliably exposed have also shrunk. For example, if CMOS transistors are exposed to voltages between their terminals that are too high, they may experience electrical overstress (EOS). EOS causes at least two breakdown mechanisms. The first EOS breakdown mechanism is known as hot carrier injection. As channel length decreases, MOS transistors experience high lateral electric fields with large drain-to-source voltages. Since the average carrier velocity saturates at high fields, the kinetic energy of the carriers increases. Because of their high kinetic energy, the carriers may penetrate and become trapped in the gate oxide or substrate and cause device failure. The second EOS breakdown mechanism is known as gate oxide breakdown. If the gate-to-source, gate-to-drain, or gate-to-body voltage difference exceeds an EOS tolerance voltage, it will create a large electric field and cause the gate oxide to breakdown. Both of these EOS breakdown mechanisms can cause transistor failure and damage the transistor over time.

Thus, for circuits that require operation at relatively high power supply voltages while using state-of-the-art CMOS manufacturing technology, it may be necessary to add on-chip voltage regulators to generate lower power supply voltages along and level shifters to convert logic signals referenced to a relatively large power supply voltage domain into logic signals referenced to a relatively small power supply domain. These additional circuits increase power consumption and integrated circuit area and cost.

Figure 1:
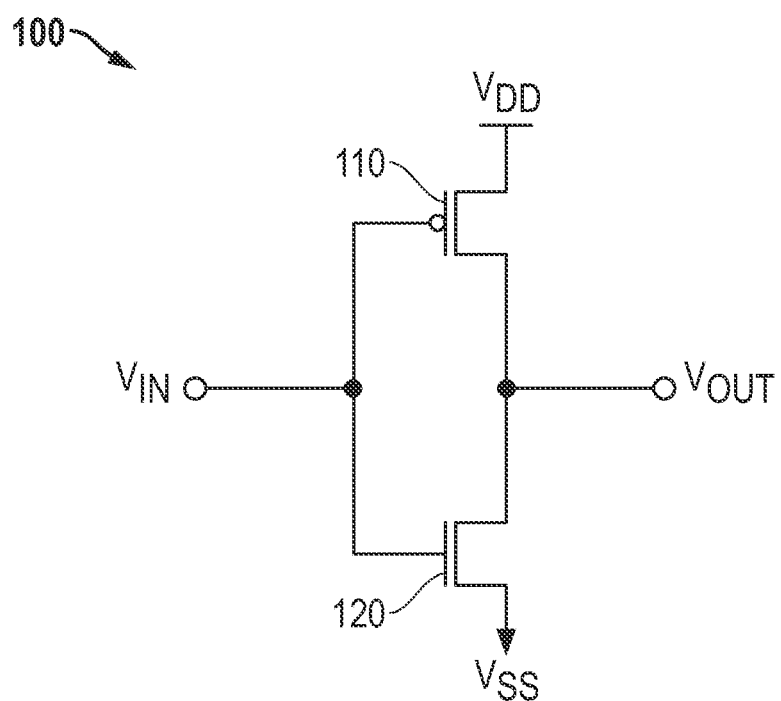
FIG. 1 illustrates in schematic form a complementary metal-oxide-semiconductor (CMOS) inverter known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A high-voltage tolerant circuit includes a first level shifter, a second level shifter, an output stage, and a reference voltage generation circuit. The first level shifter is responsive to an input signal having a first logic high voltage and a first logic low voltage for providing a first intermediate signal having the first logic high voltage and a second logic low voltage referenced to a second reference voltage higher than the first logic low voltage. The second level shifter is responsive to the input signal for providing a second intermediate signal having a second logic high voltage referenced to a first reference voltage lower than the first logic high voltage, and the first logic low voltage. The output stage is responsive to the first and second intermediate signals for providing an output signal having the first logic high voltage and the first logic low voltage. The reference voltage generation circuit provides the second logic high voltage and the second logic low voltage. The first and second level shifters provide the first and second intermediate signals, respectively, without drawing current from the reference voltage generation circuit.

A high-voltage tolerant circuit includes a first level shifter, a second level shifter, a cascoded output stage, and a reference voltage generation circuit. The first level shifter converts an input signal having a logic high voltage referenced to a first power supply voltage and a logic low voltage referenced to a second power supply voltage, to a first intermediate signal having a logic high voltage referenced to the first power supply voltage and a logic low referenced to a second reference voltage. The second level shifter converts the input signal to a second intermediate signal having a logic high voltage referenced to a first reference voltage and a logic low voltage referenced to the second power supply voltage. The output stage has first and second switching transistors responsive to the first and second intermediate signals, respectively, for providing an output signal having logic levels referenced to the first and second power supply voltages. The reference voltage generation circuit provides the first reference voltage at a value less than the first power supply voltage and the second reference voltage at a value greater than the second power supply voltage. The first level shifter and the second level shifter charge the first and second switching transistors, respectively, without drawing current from the reference voltage generation circuit.

A method includes receiving an input signal having a logic high voltage referenced to a first power supply voltage and a logic low voltage referenced to a second power supply voltage. The input signal is level shifted to a first intermediate signal having a logic high voltage referenced to the first power supply voltage and a logic low voltage referenced to a second reference voltage using a first level shifter. The input signal is level shifted to a second intermediate signal having a logic high voltage referenced to a first reference voltage and a logic low voltage referenced to the second power supply voltage using a second level shifter. An output signal having logic levels referenced to the first and second power supply voltages is providing, in which the providing includes selectively switching first and second switching transistors responsive to the first and second intermediate signals, respectively. The first reference voltage is generated at a value less than the first power supply voltage, and the second reference voltage is generated at a value greater than the second power supply voltage in a reference voltage generation circuit. Level shifting the input signal to the first intermediate signal includes level shifting the input signal to the first intermediate signal without drawing current from the reference voltage generation circuit to the first level shifter. Level shifting the input signal to the second intermediate signal includes level shifting the input signal to the second intermediate signal without drawing current from the reference voltage generation circuit to the second level shifter.

FIG. 1 illustrates in schematic form a complementary metal-oxide-semiconductor (CMOS) inverter 100 known in the prior art. CMOS inverter includes a transistor 110 and a transistor 120. Transistor 110 is a P-channel MOS transistor having a source connected to a power supply voltage terminal labelled "$V_{DD}$", a gate for receiving an input signal labelled "$V_{IN}$", and a drain for providing an output voltage labelled "$V_{OUT}$". $V_{DD}$ is a power supply voltage terminal that conducts a more positive power supply voltage. Transistor 120 is an N-channel MOS transistor having a drain connected to the drain of transistor 110, a gate for receiving $V_{IN}$, and a source connected to a more-negative power supply voltage terminal labelled "$V_{SS}$". $V_{SS}$ is a power supply voltage terminal that conducts a more negative power supply voltage, typically at 0 volts/ground. As used herein, $V_{DD}$ and $V_{SS}$ can refer either to the respective power supply voltage terminal, or to the voltage conducted on the respective power supply terminal, as indicated by the context.

In general operation, when $V_{IN}$ is a logic low voltage, transistor 110 is conductive and transistor 120 is non-conductive, causing $V_{OUT}$ to be a logic high voltage. Transistor 110 is biased above its gate-to-source threshold voltage, i.e., $|V_{GS}|>|V_{TP}|$, in which $V_{GS}$ is the absolute value of the gate-to-source voltage and $|V_{TP}|$ is the absolute value of the threshold voltage of a P-channel transistor in the manufacturing process used. Transistor 120 is biased below its gate-to-source threshold voltage, i.e., $|V_{GS}|<|V_{TN}|$, in which $|V_{TN}|$ is the absolute value of the threshold voltage of an N-channel transistor in the manufacturing process used. Since transistor 110 is conductive, it increases the voltage on a capacitive load such as the gate of other CMOS transistors in a succeeding logic stage until it is approximately equal to $V_{DD}$.

When $V_{IN}$ is a logic high voltage, transistor 110 is non-conductive and transistor 120 is conductive, causing $V_{OUT}$ to be a logic low voltage. Transistor 120 is biased above its gate-to-source threshold voltage, i.e., $|V_{GS}|>|V_{TN}|$. Transistor 110 is biased below its gate-to-source threshold voltage, i.e., $|V_{GS}|<|V_{TP}|$. Since transistor 120 is conductive, it decreases the voltage on the capacitive load of the succeeding logic stage until it is approximately equal to $V_{SS}$.

Transistors 110 and 120 experience electrical overstress (EOS) when the difference between any of the gate and source voltages, the gate and drain voltages, and the drain and source voltages exceeds an EOS tolerance value determined by the technology node. For example, assume $V_{DD}$=1.8 V and $V_{IN}$=0 V. In this case, $V_{OUT}$ is approximately equal to 1.8 V. Both the source-to-gate voltage and the drain-to-gate voltage of transistor 110 are approximately equal to 1.8 V, and the drain-to-gate voltage and the drain-to-source voltage of transistor 120 are approximately equal to 1.8 V. Next, assume $V_{DD}$=1.8 V and $V_{IN}$=1.8 V. In this case, $V_{OUT}$ is approximately equal to 0 V. The gate-to-drain voltage and source-to-drain voltage of transistor 110 are approximately equal to 1.8 V, and both the drain-to-gate voltage and the gate-to-source voltage of transistor 120 are approximately equal to 1.8 V. If transistors 110 and 120 were fabricated in a manufacturing technology in which the EOS tolerance of the transistors is equal to or greater than 1.8 V, then both transistors 110 and 120 would not experience EOS. If on the other hand, transistors 110 and 120 were fabricated in a manufacturing technology in which the EOS tolerance of the transistors is equal to 1.5 V, then both transistors 110 and 120 would experience EOS, leading to device failure over time.

Figure 2:
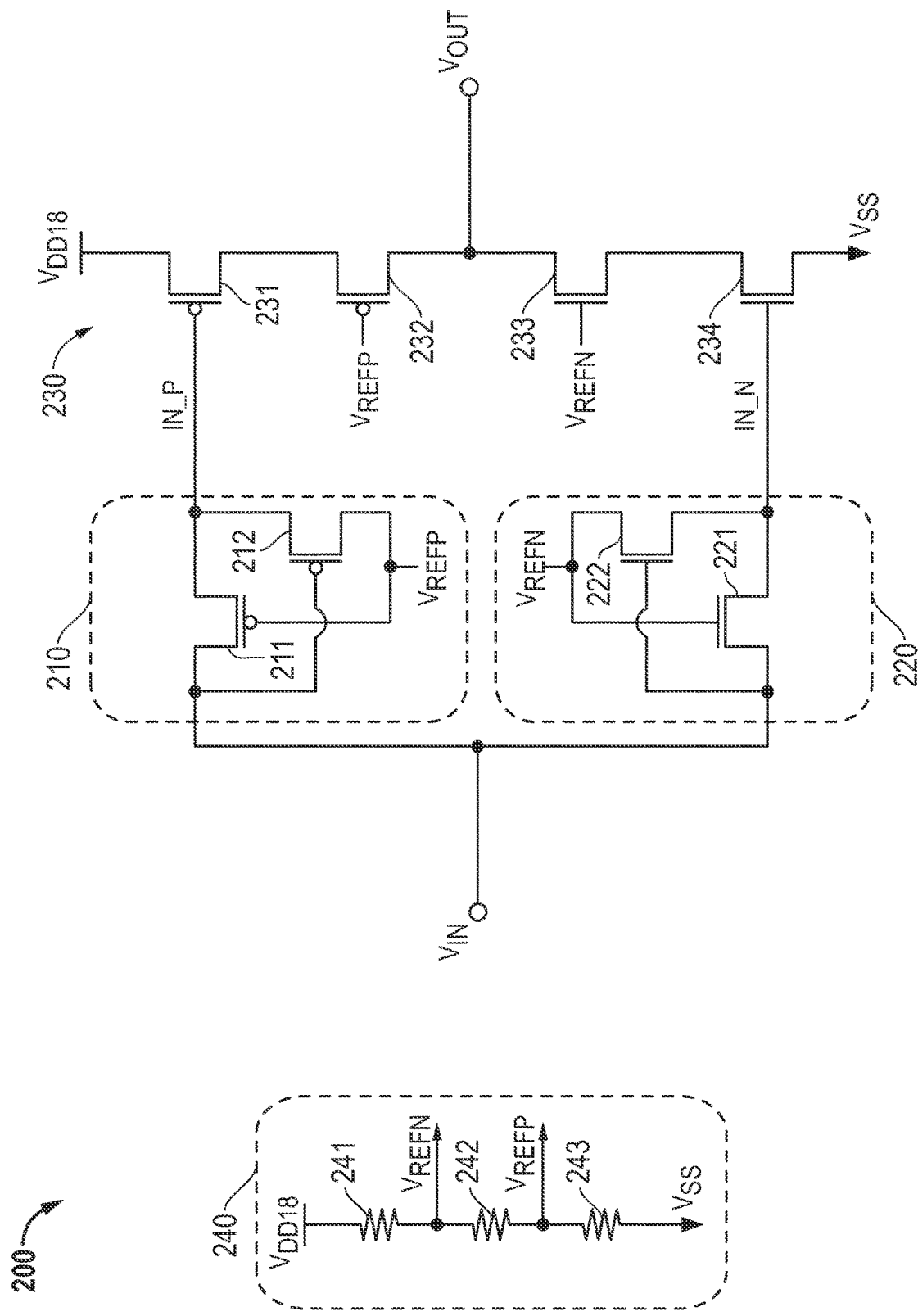
FIG. 2 illustrates in schematic form a high-voltage tolerant CMOS inverter.

FIG. 2 illustrates in schematic form a high-voltage tolerant CMOS inverter 200. High-voltage tolerant CMOS inverter 200 includes generally a first level shifter 210, a second level shifter 220, an output stage 230, and a reference voltage generation circuit 240.

First level shifter 210 includes transistors 211 and 212. Transistor 211 is a P-channel MOS transistor having a first source/drain terminal for receiving $V_{IN}$, a gate for receiving a reference voltage labelled "$V_{REFP}$", and a second source/drain terminal connected to a node labelled "IN_P". Transistor 212 is a P-channel MOS transistor having a first source/drain terminal connected to node IN_P, a gate for receiving $V_{IN}$, and a second source/drain terminal for receiving $V_{REFP}$.

Second level shifter 220 includes transistors 221 and 222. Transistor 221 is an N-channel MOS transistor having a first source/drain terminal for receiving $V_{IN}$, a gate for receiving a reference voltage labelled "$V_{REFN}$", and a second source/drain terminal connected to a node labelled "IN_N". Transistor 222 is an N-channel MOS transistor having a first source/drain terminal for receiving $V_{REFN}$, a gate for receiving $V_{IN}$, and a second source/drain terminal connected to node IN_N.

Output stage 230 includes a switching transistor 231, cascode transistors 232 and 233, and a switching transistor 234. Switching transistor 231 is a P-channel MOS transistor having a source connected to a power supply voltage terminal labelled "$V_{DD18}$", a gate connected to node IN_P, and a drain. $V_{DD18}$ is a power supply voltage terminal that conducts a more positive power supply voltage having a nominal value of 1.8 volts (V) in the example shown in FIG. 2. Cascode transistor 232 is a P-channel MOS transistor having a source connected to the drain of switching transistor 231, a gate for receiving $V_{REFP}$, and a drain for providing $V_{OUT}$. Cascode transistor 233 is an N-channel MOS transistor having a drain connected to the drain of cascode transistor 232, a gate for receiving $V_{REFN}$, and a source. Switching transistor 234 is an N-channel MOS transistor having a drain connected to the source of cascode transistor 233, a gate connected to node IN_N, and a source connected to $V_{SS}$.

Reference voltage generation circuit 240 includes resistors 241, 242, and 243. Resistor 241 has a first terminal connected to $V_{DD18}$, and a second terminal for providing $V_{REFN}$. Resistor 242 has a first terminal connected to the second terminal of resistor 241, and a second terminal for providing $V_{REFP}$. Resistor 243 has a first terminal connected to the second terminal of resistor 242, and a second terminal connected to $V_{SS}$.

In operation, high-voltage tolerant CMOS inverter 200 has additional elements and circuit blocks compared to a conventional CMOS inverter, including first level shifter 210, second level shifter 220, cascode transistors 232 and 233, and reference voltage generation circuit 240. In the example shown in FIG. 2, the EOS tolerance is 1.5 V while $V_{DD18}$ is equal to 1.8 V. Reference voltage generation circuit 240 provides voltages $V_{REFP}$ and $V_{REFN}$ to bias transistors in first level shifter 210 and second level shifter 220, respectively, and in output stage 230 to keep the maximum voltage across the terminals of any transistor under the EOS tolerance. In the example shown in FIG. 2, $V_{REFN}$=1.4 V and $V_{REFP}$=0.4 V.

When $V_{IN}$=0 V, $V_{OUT}$ is equal to 1.8 V. In first level shifter 210, transistor 212 is conductive and transistor 211 is non-conductive. Since $V_{REFP}$ is 0.4 V, the voltage on node IN_P is driven to 0.4 V instead of 0.0 V. In second level shifter 220, transistor 221 is conductive and transistor 222 is non-conductive. Transistor 221 is conductive and passes the 0 V level on $V_{IN}$ to node IN_N. Cascoded output stage 230 includes cascode transistors 232 and 233 as protection devices to reduce the voltages across the terminals of switching transistors 231 and 234 and thereby avoid EOS, and the gates of cascode transistors 232 and 233 receive $V_{REFP}$ and $V_{REFN}$, respectively, for this reason. Since the voltage on node IN_N is equal to 0 V, cascode transistor 233 and switching transistor 234 are non-conductive. However, the voltage at node IN_P is equal to 0.4 V, and switching transistor 231 and cascode transistor 232 are conductive, causing $V_{OUT}$ to be 1.8 V. Under these conditions, the voltage difference between any two terminals is less than or equal to 1.4 V, which is less than the EOS tolerance of 1.5V.

When $V_{IN}$=1.8 V, $V_{OUT}$ is equal to 0 V. In first level shifter 210, transistor 211 is conductive and transistor 212 is non-conductive. Transistor 211 is conductive and passes the 1.8 V level on $V_{IN}$ to the gate of switching transistor 231, keeping switching transistor 231 non-conductive. In second level shifter 220, transistor 221 is non-conductive, and transistor 222 is conductive and passes the 1.4 V level of $V_{REFN}$ to the gate of switching transistor 234. Cascode transistors 232 and 233 again serve as protection devices to reduce the voltages across the terminals of switching transistors 231 and 234 and thereby avoid EOS, and the gates of cascode transistors 232 and 233 receive $V_{REFP}$ and $V_{REFN}$, respectively, for this reason. Switching transistor 231 and cascode transistor 232 are non-conductive, and cascode transistor 233 and switching transistor 234 are conductive, discharging $V_{OUT}$ to 0 V. Under these conditions, the voltage difference between any two terminals is less than or equal to 1.4 V, which is less than the EOS tolerance of 1.5V.

First level shifter 210 and second level shifter 220 along with cascode transistors 232 and 233 using intermediate voltages $V_{REFN}$ and $V_{REFP}$ allow high-voltage tolerant CMOS inverter 200 to avoid causing EOS on any transistor when $V_{DD18}$=1.8 V but the EOS tolerance is only 1.5 V.

In a larger circuit with more such inverters, additional voltage regulators may be needed to generate $V_{REFN}$ and $V_{REFP}$. Reference voltage generation circuit 240 is a simple resistor divider, but is not an ideal voltage source. While resistors 241, 242, and 243 can be made relatively large, the switching current demand from $V_{REFN}$ and $V_{REFP}$ will determine the minimum static current that has to flow through the resistor divider such that the value of either $V_{REFN}$ or $V_{REFP}$ does not get significantly affected by the load.

Switching transistors 231 and 234 have relatively large gate capacitances that are charged and discharged during the operation of high-voltage tolerant CMOS inverter 200. When $V_{IN}$ switches from a logic high to a logic low, the gates of switching transistors 231 and 234 are driven to logic low voltages through first level shifter 210 and second level shifter 220, respectively. The gate capacitance of switching transistor 231 discharges through transistor 211 into the input node that receives signal $V_{IN}$ and through transistor 212 into the node that produces $V_{REFP}$. The gate capacitance of switching transistor 234 discharges through transistor 221 into $V_{IN}$. Thus, during switching of $V_{IN}$ from a logic high to a logic low, reference voltage generation circuit 240 has to sink current to discharge the gate capacitance of switching transistor 231 though resistor 243 to ground to operate at the selected frequency.

Conversely, when $V_{IN}$ switches from a logic low to a logic high, the gates of switching transistors 231 and 234 are driven to logic high voltages through first level shifter 210 and second level shifter 220, respectively. The gate capacitance of switching transistor 231 charges through transistor 211 from $V_{IN}$. The gate capacitance of switching transistor 234 charges through transistor 221 from the input node that receives signal $V_{IN}$ and through transistor 222 from the node that produces $V_{REFN}$. Thus, during switching of $V_{IN}$ from a logic low to a logic high, reference voltage generation circuit 240 has to source current to charge the gate capacitance of switching transistor 234 from power supply voltage terminal $V_{DD18}$ though resistor 241.

These currents are relatively significant. For example, in 7 nanometer (nm) CMOS technology with $V_{DD}$ equal to 1.8V and switching frequency equal to 200 megahertz (MHz), the average current demand from the nodes providing $V_{REFP}$ and $V_{REFN}$ can be as high as about 1 microampere (1 µA) for each such inverter. Because of the large amount of current needed to charge and discharge the relatively large gate capacitances of the inverter switching transistors, the resistors in reference voltage generation circuit 240 must be relatively small, but the relatively small resistances cause a static current between $V_{DD18}$ and ground to be relatively high. This static current can cause a significant increase of the overall power dissipation of the integrated circuit.

Figure 3:
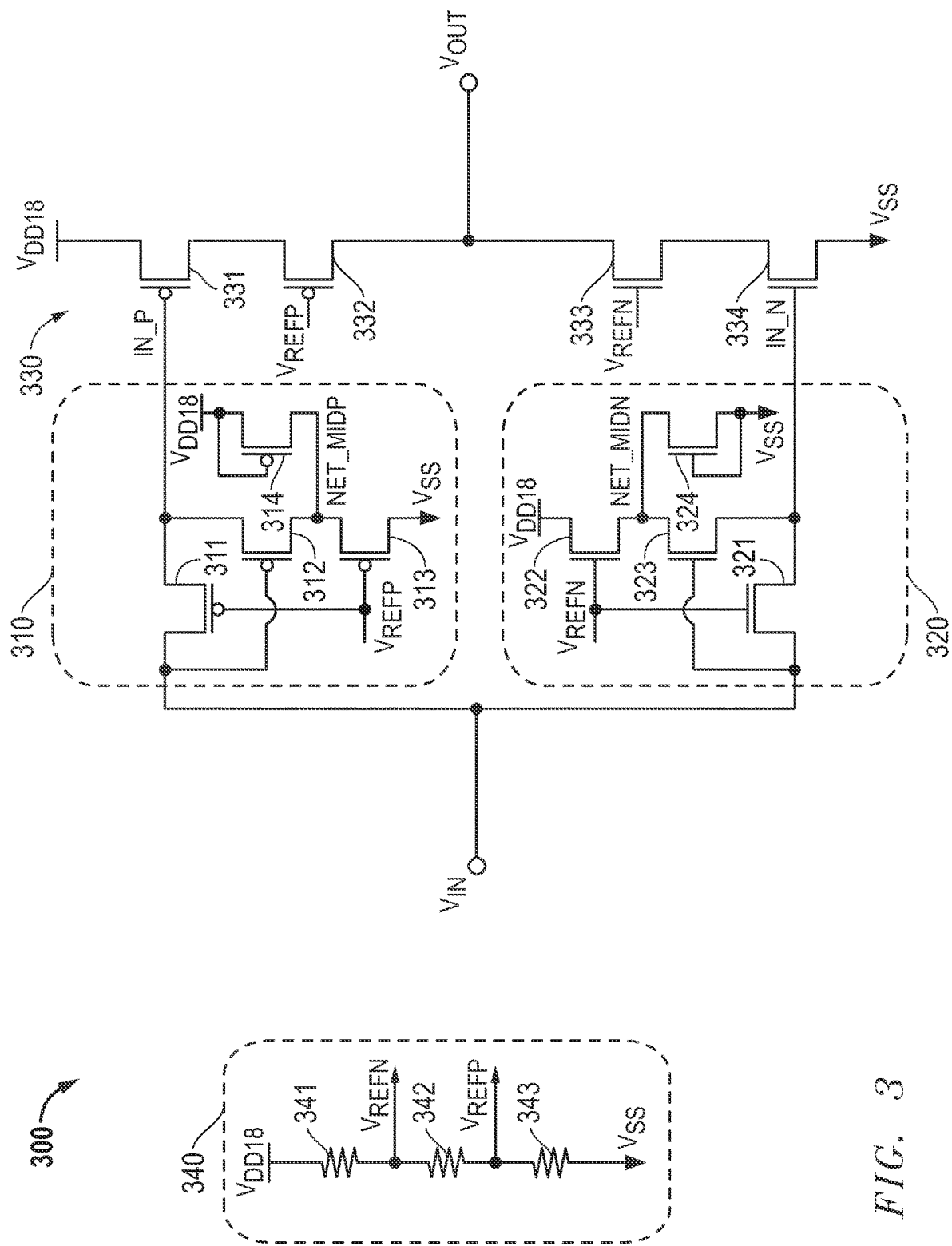
FIG. 3 illustrates in schematic form a high-voltage tolerant CMOS inverter according to some embodiments.

FIG. 3 illustrates in schematic form a high-voltage tolerant CMOS inverter 300 according to some embodiments. In FIG. 3, certain elements corresponding elements in FIG. 2 have corresponding reference numbers. High-voltage tolerant CMOS inverter 300 includes generally a first level shifter 310, a second level shifter 320, a cascode output stage 330, and a reference voltage generation circuit 340.

First level shifter 310 includes transistors 311-314. Transistor 311 is a P-channel MOS transistor having a first source/drain terminal for receiving $V_{IN}$, a gate for receiving $V_{REFP}$, and a second source/drain terminal connected to node IN_P. Transistor 312 is a P-channel MOS transistor having a first source/drain terminal connected to node IN_P, a gate for receiving $V_{IN}$, and a second source/drain terminal connected to a node labelled "NET_MIDP". Transistor 313 is a P-channel MOS transistor having a source connected to node NET_MIDP, a gate for receiving $V_{REFP}$, and a drain connected to ground. Transistor 314 is a P-channel MOS transistor having a source connected to $V_{DD18}$, a gate connected to $V_{DD18}$, and a drain connected to node NET_MIDP.

Second level shifter 320 includes transistors 321-324. Transistor 321 is an N-channel MOS transistor having a first source/drain terminal for receiving $V_{IN}$, a gate for receiving a reference voltage labelled "$V_{REFN}$", and a second source/drain terminal connected to node IN_N. Transistor 322 is an N-channel MOS transistor having a drain connected to $V_{DD18}$, a gate for receiving $V_{REFN}$, and a source connected to a node labelled "NET_MIDN". Transistor 323 has a first source/drain terminal connected to NET_MIDN, a gate for receiving $V_{IN}$, and a second source/drain terminal connected to node IN_N. Transistor 324 has a drain connected to node NET_MIDN, a gate connected to ground, and a source connected to ground.

Cascode output stage 330 includes a switching transistor 331, cascode transistors 332 and 333, and a switching transistor 334. Switching transistor 331 is a P-channel MOS transistor having a source connected to $V_{DD18}$, a gate connected to node IN_P, and a drain. Cascode transistor 332 is a P-channel MOS transistor having a source connected to the drain of switching transistor 331, a gate for receiving $V_{REFP}$, and a drain for providing $V_{OUT}$. Cascode transistor 333 is an N-channel MOS transistor having a drain connected to the drain of cascode transistor 332, a gate for receiving $V_{REFN}$, and a source. Switching transistor 334 is an N-channel MOS transistor having a drain connected to the source of cascode transistor 333, a gate connected to node IN_N, and a source connected to ground.

Reference voltage generation circuit 340 includes resistors 341, 342, and 343. Resistor 341 has a first terminal connected to $V_{DD18}$, and a second terminal for providing $V_{REFN}$. Resistor 342 has a first terminal connected to the second terminal of resistor 341, and a second terminal for providing $V_{REFP}$. Resistor 343 has a first terminal connected to the second terminal of resistor 342, and a second terminal connected to ground.

In operation, high-voltage tolerant CMOS inverter 300 operates much the same as high-voltage tolerant CMOS inverter 200 of FIG. 2 while avoiding a large current drain in reference voltage generation circuit 340, allowing resistors 341, 342, and 343 to have higher resistance and therefore for reference voltage generation circuit 340 to dissipate a smaller static current.

In high-voltage tolerant CMOS inverter 300, first level shifter 310 and second level shifter 320 have been designed such a way that $V_{REFN}$ and $V_{REFP}$ are connected only to gates of transistors. Thus, there is no significant current conducted from reference voltage generation circuit 340 through circuit nodes that receive these intermediate voltages. First level shifter 310 and second level shifter 320 are formed with different circuits so that switching current will be sourced or sunk from $V_{DD18}$ or $V_{SS}$ through transistors 322 and 313, respectively. The dynamic operation of first level shifter 310 and second level shifter 320 will now be explained.

When $V_{IN}=0$ V, transistor 312 in first level shifter 310 is conductive while transistor 311 is non-conductive. First level shifter 310 has four transistors, including transistors 313 and 314, which are always non-conductive in steady-state operation, but restrict the voltage at the drain of transistor 312 to $V_{REFP}$, or 0.4 V. After $V_{IN}$ switches to a logic low, the capacitance on the gate of switching transistor 331 discharges to the level of $V_{REFP}$. Transistor 313 is initially fully conductive, and brings node NET_MIDP to $V_{REFP}$ with the help of transistor 314. In this case, transistor 314 is always non-conductive because $V_{SG}=0V$, but provides a high RSD from $V_{DD18}$ to node NET_MIDP and helps transistor 313 to set node NET_MIDP to $V_{REFP}$. Limiting the voltage at NET_MIDP is also needed to avoid EOS on transistor 312 when $V_{IN}$ later switches to 1.8 V. While $V_{IN}$ is transitioning from 1.8 V to 0 V in high-voltage tolerant CMOS inverter 200 of FIG. 2, reference voltage generation circuit 240 sinks the discharge current through $V_{REFP}$. On the other hand, in high-voltage tolerant CMOS inverter 300, the gate of transistor 313 receives and remains at $V_{REFP}$. During switching, transistor 313 restricts the voltage at node NET_MIDP to $V_{REFP}$, while sinking the switching current to $V_{SS}$. In this way, first level shifter 310 requires no switching current from reference voltage generation circuit 340. In second level shifter 320, transistor 321 is conductive, and transistors 322, 323, and 324 are non-conductive. Since transistor 321 is fully conductive, it discharges the gate of switching transistor 334 to 0 V without causing any addition current flow in reference voltage generation circuit 340.

Thus, when $V_{IN}=0$ V, switching transistor 334 and cascode transistor 333 are non-conductive and switching transistor 331 and cascode transistor 332 are conductive, causing $V_{OUT}$ to be 1.8 V. Because the voltage at the gate of switching transistor 331 is at 0.4 V, the voltage difference between any two terminals of any transistor in cascode output stage 330 is no more than 1.4 V, which is less than the allowed EOS tolerance of 1.5 V in this example.

When $V_{IN}=1.8$ V in second level shifter 320, transistor 323 is conductive while transistor 321 is non-conductive. Second level shifter 320 has four transistors, including transistors 322 and 324, which are always non-conductive in steady-state operation, but restrict the voltage at node NET_MIDN to $V_{REFN}$, or 1.4 V. After $V_{IN}$ switches to a logic high, the capacitance on the gate of transistor 334 charges to the level of $V_{REFN}$. Transistor 322 is initially fully conductive, and brings node NET_MIDN to $V_{REFN}$ with the help of transistor 324. In this case, transistor 324 is always non-conductive because $V_{GS}=0V$, but provides a high $R_{DS}$ from node NET_MIDN to ground and helps transistor 322 to set the NET_MIDN node to $V_{REFN}$. Limiting the voltage at NET_MIDN is also needed to avoid EOS on transistor 323 when $V_{IN}$ later switches to 0 V. While $V_{IN}$ is transitioning from 0 V to 1.8 V in high-voltage tolerant CMOS inverter 200 of FIG. 2, reference voltage generation circuit 240 sources the current through $V_{REFN}$. On the other hand, in high-voltage tolerant CMOS inverter 300, the gate of transistor 322 receives and remains at $V_{REFN}$. During switching, transistor 322 restricts the voltage at node NET_MIDN to $V_{REFN}$, while sourcing switching current from $V_{DD18}$. In this way, second level shifter 320 requires no switching current from reference voltage generation circuit 340. In first level shifter 310, transistor 311 is conductive, and transistors 312, 313, and 314 are non-conductive. Since transistor 311 is conductive, it will pass a clean 1.8 V to the gate of switching transistor 331 without causing any addition current flow in reference voltage generation circuit 340.

Thus, when $V_{IN}=1.8$ V, switching transistor 331 and cascode transistor 332 are non-conductive, and cascode transistor 333 and switching transistor 334 are conductive, causing $V_{OUT}$ to be 0 V. Because the voltage at the gate of switching transistor 334 is at 1.4 V, the voltage difference between any two terminals of any transistor in cascode output stage 330 is no more than 1.4 V, which is less than the allowed EOS tolerance of 1.5 V in this example.

Compared to high-voltage tolerant CMOS inverter 200 of FIG. 2, high-voltage tolerant CMOS inverter 300 reduces average current by greater than 99% under the same operating conditions because of reduced switching current demand from first level shifter 310 and second level shifter 320. In addition, static current from reference voltage generation circuit 340 is also reduced significantly. Moreover, an inverter is a basic building block of any digital logic circuit, and a typical macrocell may contain a few tens or hundreds of inverter instances. Thus, the reduction in current demand can be very significant while also reducing or eliminating EOS problems.

Moreover, the basic inverter configuration of high-voltage tolerant CMOS inverter 300 can be easily modified using well-known circuit techniques to form other common logic functions, such as NAND gates, NOR gates, exclusive-OR gates, etc. For example, multiple sets of level shifters corresponding to first level shifter 310 and switching transistors corresponding to switching transistor 331 can be connected in series with a cascode transistor corresponding to cascode transistor 332 to form a pullup portion of a NAND gate. Multiple sets of level shifters corresponding to second level shifter 320 and switching transistor and cascode transistor pairs corresponding to switching transistor 334 and cascode transistor 333 could be connected in parallel to form a pulldown portion of the NAND gate. The parallel legs in the pulldown sections are switched by true logic signals, whereas the series transistors are switched by complements of the respective true logic signals, to complete the NAND function.

In some embodiments, the output voltage swing can be reduced to support signaling in different voltage domains. Two examples of inverters that provide reduced output voltage swing will now be given.

Figure 4:
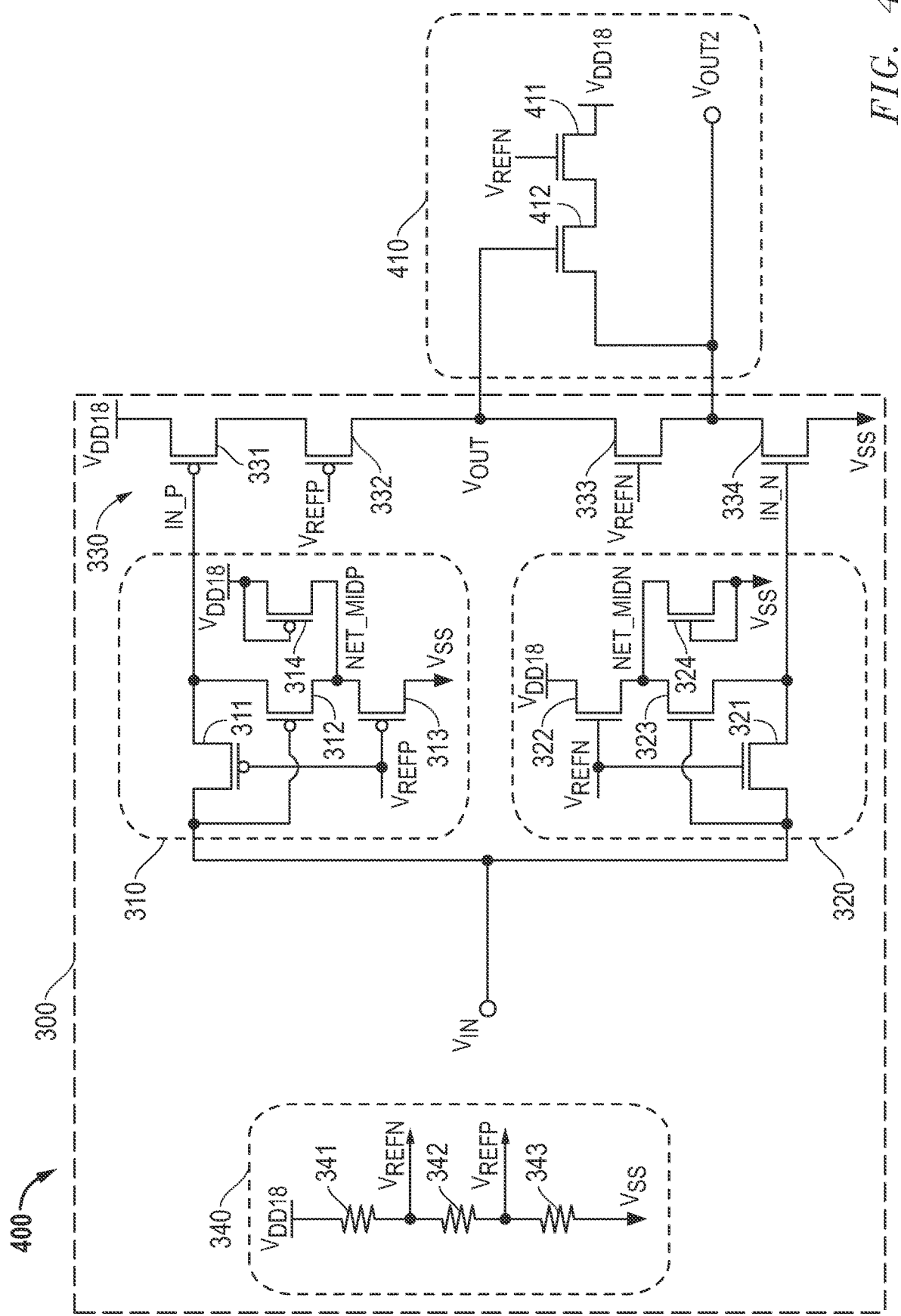
FIG. 4 illustrates in schematic form a high-voltage tolerant CMOS inverter with a first output level shifter according to some embodiments.

FIG. 4 illustrates in schematic form a high-voltage tolerant CMOS inverter 400 with a first output level shifter 410 according to some embodiments. High-voltage tolerant CMOS inverter 400 includes high-voltage tolerant CMOS inverter 300 as previously described and first output level shifter 410. First output level shifter 410 includes transistors 411 and 412. Transistor 411 is an N-channel MOS transistor having a drain connected to $V_{DD18}$, a gate for receiving reference voltage $V_{REFN}$, and a source. Transistor 412 is an N-channel MOS transistor having a drain connected to the source of transistor 411, a gate for receiving $V_{OUT}$, and a source connected to the source of cascode transistor 333 and the drain of switching transistor 334 and providing a second output signal labelled "$V_{OUT2}$".

First output level shifter 410 limits $V_{OH}$ to be equal to $V_{REFN}$ such that the voltage swing on $V_{OUT2}$ is between 0 V (when $V_{IN}$=1.8 V) and $V_{REFN}$ (when $V_{IN}$=0 V). When $V_{IN}$=0 V, cascode transistor 333 and switching transistor 334 are non-conductive, switching transistor 331 and cascode transistor 332 are conductive, and $V_{OUT}$ is equal to 1.8 V. Transistor 411 is non-conductive and sets the voltage at its source to approximately $V_{REFN}$. Since $V_{OUT}$ is equal to 1.8 V, transistor 412 is conductive and passes 1.4 V to its source, forming $V_{OUT2}$. Thus, first output level shifter 410 limits $V_{OH}$ of $V_{OUT2}$ to $V_{REFN}$, or in this example, about 1.4 V. Transistor 411 provides switching current from the $V_{DD18}$ supply to the drain of transistor 412, and avoids any current drain from reference voltage generation circuit 340. The voltage difference between any two terminals of transistors 411 and 412 is limited to 0.4 V. In particular, the drain, gate, and source voltages of transistor 411 are 1.8 V, 1.4 V, and 1.4 V, respectively, limiting the difference between any two pairs of terminals to 0.4 V. The drain, gate, and source voltages of transistor 412 are 1.4 V, 1.8 V, and 1.4 V, respectively, limiting the difference between any two pairs of terminals to 0.4 V.

When $V_{IN}$=1.8 V, switching transistor 331 and cascode transistor 332 are non-conductive, cascode transistor 333 and switching transistor 334 are conductive, and $V_{OUT}$ is equal to 0 V. Transistor 411 is non-conductive and sets the voltage at its source to approximately $V_{REFN}$. Since $V_{OUT}$ is equal to 0 V, transistor 412 is also non-conductive, and switching transistor 334 drives $V_{OUT2}$ to 0 V. The voltage difference between any two terminals of transistors 411 and 412 is limited to 1.4V. In particular, the drain, gate, and source voltages of transistor 411 are at 1.8V, 1.4 V, and 1.4 V, respectively, limiting the difference between any two pairs of terminals to 0.4 V. The drain, gate, and source voltages of transistor 412 are at 1.4 V, 0 V, and 0V, respectively, limiting the difference between any two pairs of terminals to 1.4 V.

Thus, first output level shifter 410 establishes the VOL of $V_{OUT2}$ at 0 V and the $V_{OH}$ of $V_{OUT2}$ at 1.4 V, and limits the voltage difference between any two terminals of transistors 411 and 412 to 1.4 V or less, which is less than the EOS tolerance of 1.5 V. First output level shifter 410 also does not draw any current from reference voltage generation circuit 340.

Figure 5:
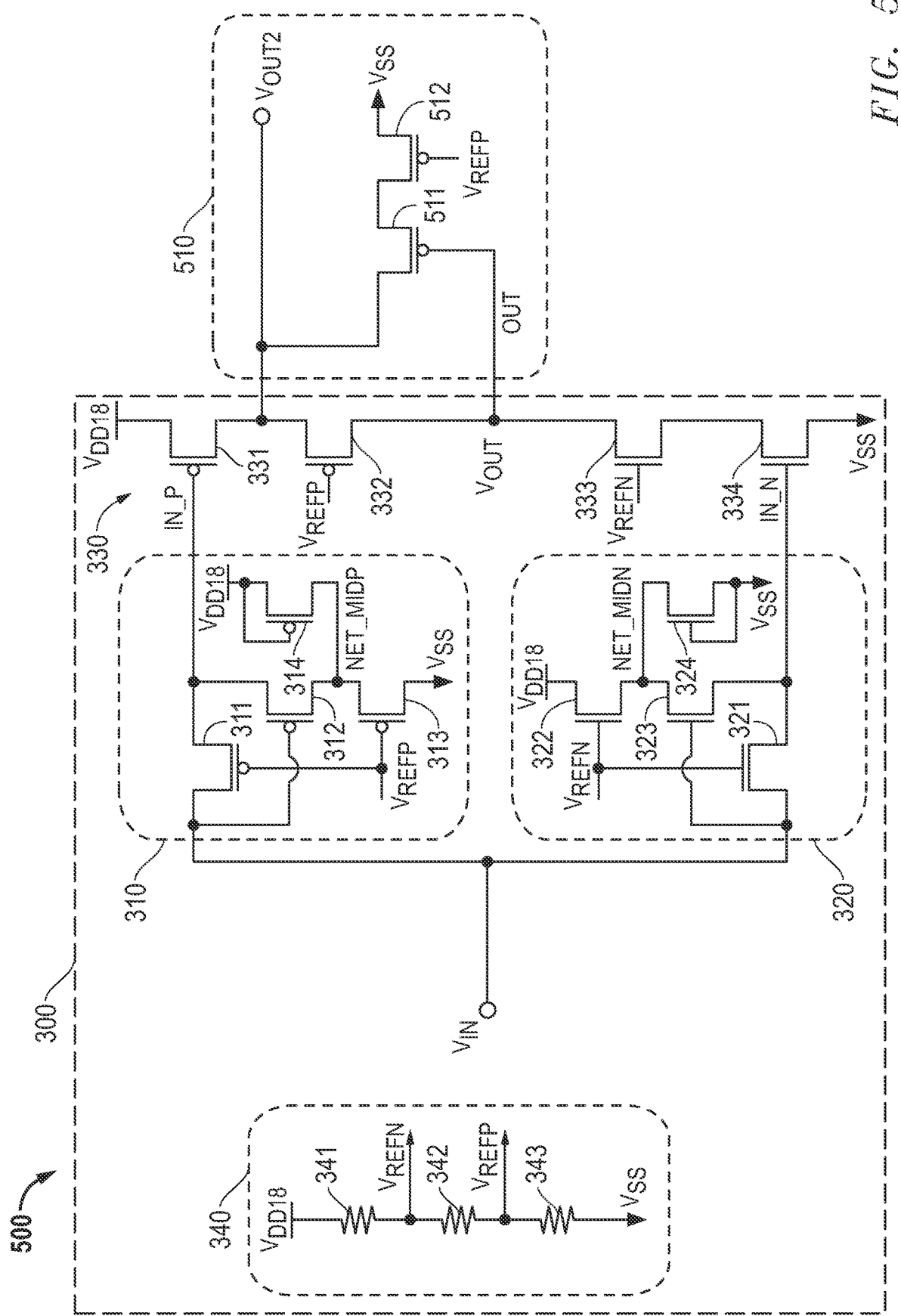
FIG. 5 illustrates in schematic form a high-voltage tolerant CMOS inverter with a second output level shifter according to some embodiments.

FIG. 5 illustrates in schematic form a high-voltage tolerant CMOS inverter 500 with a second output level shifter 510 according to some embodiments. High-voltage tolerant CMOS inverter 500 includes high-voltage tolerant CMOS inverter 300 as previously described and a second output level shifter 510. Second output level shifter 510 includes transistors 511 and 512. Transistor 511 is a P-channel MOS transistor having a source connected to the drain of switching transistor 331 and the source of cascode transistor 332 and providing $V_{OUT2}$, a gate for receiving output voltage $V_{OUT}$, and a drain. Transistor 512 is a P-channel MOS transistor having a source connected to the drain of transistor 511, a gate for receiving $V_{REFP}$, and a drain connected to $V_{SS}$.

Second output level shifter 510 limits VOL to be equal to $V_{REFP}$ such that the voltage swing on $V_{OUT2}$ is between 0.4 V (when $V_{IN}$=1.8 V) and $V_{DD18}$ (when $V_{IN}$=0 V). When $V_{IN}$=0 V, switching transistor 331 and cascode transistor 332 are conductive, cascode transistor 333 and switching transistor 334 are non-conductive, and $V_{OUT}$ is equal to 1.8 V. Transistor 512 is again non-conductive and sets the voltage at its source to approximately $V_{REFP}$. Since $V_{OUT}$ is equal to 1.8 V, transistor 511 is non-conductive, and switching transistor 331 drives $V_{OUT2}$ to $V_{DD18}$. The voltage difference between any two terminals of transistors 511 and 512 is limited to 0.4V. In particular, the source, gate, and drain voltages of transistor 512 are 0.4 V, 0.4 V, and 0 V, respectively, limiting the difference between any two pairs of terminals to 0.4 V. The source, gate, and drain voltages of transistor 511 are 1.8 V, 1.8 V, and 0.4 V, respectively, limiting the difference between any two pairs of terminals to 1.4 V.

When $V_{IN}$=1.8 V, switching transistor 331 and cascode transistor 332 are non-conductive, cascode transistor 333 and switching transistor 334 are conductive, and $V_{OUT}$ is equal to 0 V. Transistor 512 is non-conductive and sets the voltage at its source to approximately $V_{REFP}$. Since $V_{OUT}$ is equal to 0 V, transistor 511 is conductive and passes 0.4 V to its source, forming $V_{OUT2}$. Thus, second output level shifter 510 limits VOL to $V_{REFP}$, or in this example, about 0.4 V. Transistor 512 provides switching current from the $V_{SS}$ supply to the drain of transistor 511, and avoids any current drain from reference voltage generation circuit 340. The voltage difference between any two terminals of transistors 511 and 512 is limited to 0.4 V. In particular, the source, gate, and drain voltages of transistor 511 are 1.8 V, 1.4 V, and 1.4 V, respectively, limiting the difference between any two pairs of transistors to 0.4 V. The source, gate, and drain voltages of transistor 512 are 0 V, 0.4 V, and 0.4 V, respectively, limiting the difference between any two pairs of terminals to 0.4 V.

Thus, second output level shifter 510 establishes the VOL of $V_{OUT2}$ at 0.4 V and the $V_{OH}$ of $V_{OUT2}$ at 1.8 V, and limits the voltage difference between any two terminals of transistors 511 and 512 to 1.4 V or less, which is less than the EOS tolerance of 1.5 V. Second output level shifter 510 also does not draw any current from reference voltage generation circuit 340.

The disclosed high-voltage tolerant circuit allows a logic circuit, e.g., a CMOS inverter, to be formed to switch input logic levels and output logic levels that are greater than an EOS tolerance level without causing harmful EOS to appear between any two pairs of terminals of the transistors. For example, the circuit allows transistors with an EOS tolerance of 1.5 V to be used in a circuit having a 1.8 V power supply without exposing pairs of terminals to voltages as high as 1.5 V. Moreover, the high-voltage tolerant circuit avoids drawing switching currents from a reference voltage generation circuit, and thus avoids high static currents that would flow even when the high-voltage tolerant circuit is not switching. First and second output level shifters were also disclosed that allow a reduction in the input logic level voltage swing to a smaller output logic level voltage swing without causing the transistors in the output level shifters to be exposed to voltages high enough to cause EOS.

High-voltage tolerant CMOS inverters 300, 400, and 500 or any portions thereof may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, high-voltage tolerant CMOS inverters 300, 400, and 500 were implemented using CMOS transistors, but the present principles can be applied to any similar transistor types that are susceptible to EOS when relatively high voltage differences appear across their terminals. Moreover, high-voltage tolerant CMOS inverters 300, 400, and 500 could be used in integrated circuits that include only with a single voltage domain having logic levels that cause EOS when applied across two terminals, or that include lower voltage circuit domains. High-voltage tolerant CMOS inverters 300, 400, and 500 could be formed as inverters, or could be used as building blocks for more complex logic functions such as NAND, NOR, XOR, and the like by adding switching transistors selectively in series or in parallel with the pullup or pull-down side, as appropriate.

Accordingly, it is intended by the appended claims to cover all modifications of the disclosed embodiments that fall within the scope of the disclosed embodiments.

What is claimed is:

1. A high-voltage tolerant circuit comprising:
   a first level shifter responsive to an input signal having a first logic high voltage and a first logic low voltage for providing a first intermediate signal having said first logic high voltage and a second logic low voltage referenced to a second reference voltage higher than said first logic low voltage;
   a second level shifter responsive to said input signal for providing a second intermediate signal having a second logic high voltage referenced to a first reference voltage lower than said first logic high voltage, and said first logic low voltage; and
   an output stage responsive to said first and second intermediate signals for providing an output signal having said first logic high voltage and said first logic low voltage; and
   a reference voltage generation circuit for providing said second logic high voltage and said second logic low voltage,
   wherein said first and second level shifters provide said first and second intermediate signals, respectively, without drawing current from said reference voltage generation circuit.

2. The high-voltage tolerant circuit of claim 1, wherein said reference voltage generation circuit comprises:
   a first resistor having a first terminal coupled to a first power supply voltage terminal, and a second terminal for providing said first reference voltage;
   a second resistor having a first terminal coupled to said second terminal of said first resistor, and a second terminal for providing said second reference voltage; and
   a third resistor having a first terminal coupled to said second terminal of said second resistor, and a second terminal coupled to a second power supply voltage terminal.

3. The high-voltage tolerant circuit of claim 1, wherein said first level shifter comprises:
   a first P-channel MOS transistor having a first source/drain terminal for receiving said input signal, a gate for receiving said second reference voltage, and a second source/drain terminal coupled to said output stage;
   a second P-channel MOS transistor having a first source/drain terminal coupled to said second source/drain terminal of said first P-channel MOS transistor, a gate for receiving said input signal, and a second source/drain terminal;
   a third P-channel MOS transistor having a source coupled to said second source/drain terminal of said second P-channel MOS transistor, a gate for receiving said said second reference voltage, and a drain coupled to a second power supply voltage terminal; and
   a fourth P-channel MOS transistor having a source coupled to a first power supply voltage terminal, a gate coupled to said source, and a drain said second source/drain terminal of said second P-channel MOS transistor, and to said source of said third P-channel MOS transistor.

4. The high-voltage tolerant circuit of claim 1, wherein said second level shifter comprises:
   a first N-channel MOS transistor having a first source/drain terminal for receiving said input signal, a gate for receiving said first reference voltage, and a second source/drain terminal coupled to said output stage;
a second N-channel MOS transistor having a drain terminal coupled to a first power supply voltage terminal, a gate for receiving said first reference voltage, and a source;
a third N-channel MOS transistor having a first source/drain terminal coupled to said source of said second N-channel MOS transistor, a gate for receiving said input signal, and a second source/drain terminal coupled to said second source/drain terminal of said first N-channel MOS transistor; and
a fourth N-channel MOS transistor having a drain coupled to said second source/drain terminal of said second N-channel MOS transistor, a gate, and a source coupled to said gate thereof and to a second power supply voltage terminal.

5. The high-voltage tolerant circuit of claim 1, wherein said output stage comprises:
a P-channel MOS switching transistor having a source coupled to a first power supply voltage terminal, a gate for receiving said first intermediate signal, and a drain;
a P-channel MOS cascode transistor having a source coupled to said drain of said P-channel MOS switching transistor, a gate for receiving said second reference voltage, and a drain for providing said output signal;
an N-channel MOS cascode transistor having a drain coupled to said drain of said P-channel MOS cascode transistor, a gate for receiving said first reference voltage, and a source; and
an N-channel MOS switching transistor having a drain coupled to said source of said N-channel MOS cascode transistor, a gate for receiving said second intermediate signal, and a source coupled to a second power supply voltage terminal.

6. The high-voltage tolerant circuit of claim 5, wherein a difference between said first logic high voltage and said first logic low voltage is greater than a highest rated gate-to-source, drain-to-source, and gate-to-drain voltages of at least one of said P-channel MOS switching transistor, said P-channel MOS cascode transistor, said N-channel MOS cascode transistor, and said N-channel MOS switching transistor.

7. The high-voltage tolerant circuit of claim 5, further comprising an output level shifter, said output level shifter comprising:
a first N-channel level shift transistor having a drain coupled to said first power supply voltage terminal, a gate for receiving said first reference voltage, and a source; and
a second N-channel level shift transistor having a drain coupled to said source of said first N-channel level shift transistor, a gate for receiving said output signal, and a source coupled to said drain of said N-channel MOS switching transistor.

8. The high-voltage tolerant circuit of claim 5, further comprising an output level shifter, said output level shifter comprising:
a first P-channel level shift transistor having a source coupled to said drain of said P-channel MOS switching transistor, a gate for receiving said output signal, and a drain; and
a second P-channel level shift transistor having a source coupled to said drain of said first P-channel level shift transistor, a gate for receiving said second reference voltage, and a source coupled to said second power supply voltage terminal.

9. A high-voltage tolerant circuit comprising:
a first level shifter for converting an input signal having a logic high voltage referenced to a first power supply voltage and a logic low voltage referenced to a second power supply voltage, to a first intermediate signal having a logic high voltage referenced to said first power supply voltage and a logic low referenced to a second reference voltage;
a second level shifter for converting said input signal to a second intermediate signal having a logic high voltage referenced to a first reference voltage and a logic low voltage referenced to said second power supply voltage;
an output stage having first and second switching transistors responsive to said first and second intermediate signals, respectively, for providing an output signal having logic levels referenced to said first and second power supply voltages; and
a reference voltage generation circuit for providing said first reference voltage at a value less than said first power supply voltage and said second reference voltage at a value greater than said second power supply voltage,
wherein said first level shifter and said second level shifter charge said first and second switching transistors, respectively, without drawing current from said reference voltage generation circuit.

10. The high-voltage tolerant circuit of claim 9, wherein a difference between said logic high voltage and said logic low voltage is greater than highest rated gate-to-source and drain-to-source voltages of at least one of at least one of said first switching transistor and said second switching transistor.

11. The high-voltage tolerant circuit of claim 9, wherein said first level shifter comprises:
a first P-channel MOS transistor having a first source/drain terminal for receiving said input signal, a gate for receiving said second reference voltage, and a second source/drain terminal providing said first intermediate signal;
a second P-channel MOS transistor having a first source/drain terminal coupled to said second source/drain terminal of said first switching transistor, a gate for receiving said input signal, and a second source/drain terminal;
a third P-channel MOS transistor having a source coupled to said second source/drain terminal of said second P-channel MOS transistor, a gate for receiving said second reference voltage, and a drain for receiving said second power supply voltage; and
a fourth P-channel MOS transistor having a source for receiving said first power supply voltage, a gate coupled to said source thereof, and a drain coupled to said second source/drain terminal of said second P-channel MOS transistor.

12. The high-voltage tolerant circuit of claim 9, wherein said second level shifter comprises:
a first N-channel MOS transistor having a first source/drain terminal for receiving said input signal, a gate for receiving said first reference voltage, and a second source/drain terminal providing said second intermediate signal; and
a second N-channel MOS transistor having a drain for receiving said first power supply voltage, a gate for receiving said first reference voltage, and a source;
a third N-channel MOS transistor having a first source/drain terminal coupled to said source of said second N-channel MOS transistor, a gate for receiving said input signal, and a second source/drain terminal coupled to said second source/drain terminal of said first N-channel MOS transistor; and a fourth N-channel MOS transistor having a drain coupled to said source of said second N-channel MOS transistor, a gate for receiving said second power supply voltage, and a source for receiving said second power supply voltage.

13. The high-voltage tolerant circuit of claim 9, wherein said reference voltage generation circuit comprises:
   a first resistor having a first terminal coupled to a first power supply voltage terminal, and a second terminal for providing said first reference voltage;
   a second resistor having a first terminal coupled to said second terminal of said first resistor, and a second terminal for providing said second reference voltage; and
   a third resistor having a first terminal coupled to said second terminal of said second resistor, and a second terminal coupled to a second power supply voltage terminal.

14. The high-voltage tolerant circuit of claim 9, wherein:
   said first switching transistor comprises a P-channel MOS switching transistor having a source for receiving said first power supply voltage, a gate for receiving said first intermediate signal, and a drain; and
   said second switching transistor comprises an N-channel MOS switching transistor having a drain, a gate for receiving said first intermediate signal, and a source for receiving said second power supply voltage.

15. The high-voltage tolerant circuit of claim 14, wherein said output stage is a cascoded output stage and further comprises:
   a first cascode transistor comprising a P-channel MOS transistor having a source coupled to said drain of said first switching transistor, a gate for receiving said second reference voltage, and a drain for providing said output signal; and
   a second cascode transistor comprising an N-channel MOS transistor having a drain coupled to said drain of said first cascode transistor, a gate for receiving said first reference voltage, and a source coupled to said drain of said second switching transistor.

16. The high-voltage tolerant circuit of claim 15, further comprising an output level shifter, said output level shifter comprising:
   a first N-channel level shift transistor having a drain for receiving said first power supply voltage, a gate for receiving said first reference voltage, and a source; and
   a second N-channel level shift transistor having a drain coupled to said source of said first N-channel level shift transistor, a gate for receiving said output signal, and a source coupled to said drain of said N-channel MOS switching transistor.

17. The high-voltage tolerant circuit of claim 15, further comprising an output level shifter, said output level shifter comprising:

a first P-channel level shift transistor having a source coupled to said drain of said P-channel MOS switching transistor, a gate for receiving said output signal, and a drain; and a second P-channel level shift transistor having a source coupled to said drain of said first P-channel level shift transistor, a gate for receiving said second reference voltage, and a source for receiving said second power supply voltage.

18. A method comprising:
   receiving an input signal having a logic high voltage referenced to a first power supply voltage and a logic low voltage referenced to a second power supply voltage;
   level shifting said input signal to a first intermediate signal having a logic high voltage referenced to said first power supply voltage and a logic low voltage referenced to a second reference voltage using a first level shifter;
   level shifting said input signal to a second intermediate signal having a logic high voltage referenced to a first reference voltage and a logic low voltage referenced to said second power supply voltage using a second level shifter;
   providing an output signal having logic levels referenced to said first and second power supply voltages, said providing comprising selectively switching first and second switching transistors responsive to said first and second intermediate signals, respectively; and
   generating said first reference voltage at a value less than said first power supply voltage and said second reference voltage at a value greater than said second power supply voltage in a reference voltage generation circuit,
   wherein level shifting said input signal to said first intermediate signal comprises level shifting said input signal to said first intermediate signal without drawing current from said reference voltage generation circuit to said first level shifter, and level shifting said input signal to said second intermediate signal comprises level shifting said input signal to said second intermediate signal without drawing current from said reference voltage generation circuit to said second level shifter.

19. The method of claim 18, wherein generating said first and second reference voltages comprises:
   dividing a voltage difference between said first power supply voltage and said second power supply voltage into said first and second reference voltages.

20. The method of claim 18, wherein said selectively switching said first and second switching transistors comprises:
   reducing voltages at drains of said first and second switching transistors using a first cascode transistor and a second cascode transistor, respectively.

* * * * *